United States Patent [19]

Naito et al.

[11] Patent Number: 4,808,857

[45] Date of Patent: Feb. 28, 1989

[54] SENSE AMPLIFIER CIRCUIT FOR SWITCHING PLURAL INPUTS AT LOW POWER

[75] Inventors: Atsushi Naito; Kiyoshi Nakatsuka; Takashi Inui; Tomohiro Suzuki, all of Miho, Japan

[73] Assignee: Texas Instruments Incorporated, Dallas, Tex.

[21] Appl. No.: 203,608

[22] Filed: Jun. 2, 1988

Related U.S. Application Data

[63] Continuation of Ser. No. 53,456, May 22, 1987, abandoned.

[30] Foreign Application Priority Data

May 30, 1986 [JP] Japan .............................. 61-125455

[51] Int. Cl.$^4$ .................. H03K 19/094; H03K 17/693
[52] U.S. Cl. ..................... 307/530; 307/243; 307/355; 365/208
[58] Field of Search ............... 307/443, 448, 350, 530, 307/355, 243; 365/205–208, 221, 240

[56] References Cited

U.S. PATENT DOCUMENTS

| | | | |
|---|---|---|---|
| 4,606,012 | 8/1986 | Koshizuka | 307/530 X |
| 4,634,900 | 1/1987 | Koshizuka | 307/530 |
| 4,634,901 | 1/1987 | McElroy | 307/443 X |
| 4,639,890 | 1/1987 | Heilveil et al. | 365/189 X |
| 4,648,077 | 3/1987 | Pinkham et al. | 365/189 X |
| 4,649,301 | 3/1987 | Van Tran | 307/530 |
| 4,689,741 | 8/1987 | Redwine et al. | 365/189 X |

OTHER PUBLICATIONS

Forman, "Dynamic Video RAM Snaps the Bond Between Memory and Screen Refresh", *Electronic Design*, May 1985, pp. 117–124.

NEC Specification Sheet for Part No. $\mu$PD41264 256K Dual Port DRAM, NEC Electronics, Inc., Jan. 1985.

*Primary Examiner*—David Hudspeth
*Attorney, Agent, or Firm*—William E. Hiller; N. Rhys Merrett; Melvin Sharp

[57] ABSTRACT

A sense amplifier circuit is described for switching plural inputs at high speed. At least two transistors for providing at least two true input signals are connected in parallel and have their source terminals connected to a common node from which an output signal may be read. Similarly, at least two other transistors for providing the inverse of the true input signals are connected in parallel and their source terminals are connected to another common node from which an inverse of the output signal may be read. The common nodes are then precharged to the same voltage. True and inverse input signals are applied to their respective transistors through transfer gates where all the true input signals are greater than their respective inverse signals. Therefore, the on-resistance of each of the transistors to which a true input is applied have a higher on-resistance than the associated transistors to which an inverse input is applied. Current flow then rapidly decreases through the transistors transmitting the inverse input signal as current is switchably applied to the transistors transmitting the true input signals.

5 Claims, 3 Drawing Sheets

SENSE AMPLIFIER CIRCUIT FOR SWITCHING PLURAL INPUTS AT LOW POWER

This application is a continuation of application Ser. No. 053,456, filed 5/22/87, abandoned.

BACKGROUND OF THE INVENTION

1. Field of the Invention

The present invention relates to a sense amplifier circuit.

2. Description of the Prior Art

In the prior art, for example, in the field of computer graphics, a multiport video memory is often used. When such a multiport video memory is used as a video RAM, it may comprise a combination of a dynamic RAM (Random Access Memory) and a data register. In such a video memory, a transfer function called mid-scan load, is necessary to modify data into new output data and to output the new data in a short time, for example, 33 nsec. However, a sense amplifier circuit which can perform such high speed switching with low power has not been available until now.

FIG. 1 shows a sense amplifier circuit of the prior art, the operation of which will be explained below:

(1) First, LINE, LINEB, OUT and OUTB are subjected to a precharge voltage when C1 is at an "H" (high) state, and C1 is shifted to a "L" (low) state after they are precharged enough.

(2) Next, it is assumed BIT=$V_{DD}$ and BITB=$V_{SS}$. When the voltage of T1 comes up to "H", it takes a certain time for the voltage of LINE B to go down, due to the large floating capacitance Q of LINE B. During this time, the transistors 12 and 13 are held in an "ON" state (i.e. when the voltage value of LINE B is greater than VT; VT being a threshold voltage of a MOS transistor). Therefore, when the transistors 12, 13, 12' and 13' are on, the on-resistance of the transistors 12 and 13 is larger than that of the transistors 12' and 13'.

(3) C2 comes up to "H" several nsec after T1 comes up to "H" to discharge LINE, LINE B, OUT and OUT B to $V_{SS}$. However, LINE B AND OUT B discharge more quickly because of the above described difference of on-resistance. The transistors 12 and 13 are then turned off when the voltage of LINE B is less than $V_T$. Therefore, OUT B and OUT have respective outputs OUT B="H" (high) and OUT="L" (low).

In the above described circuit, current flows through the transistors 11, 12 and 15 as described in (3) resulting in an increase of consumed power. In the above described sense amplifier circuit, selection of two inputs is implemented by switching between the transfer gates 11, 11', 16, and 16'. However, the precharge by C1 is indispensable in order for T1 or T2 to be on. Further, T1 and T2 cannot be switched "off" in succession without discharging C1. Therefore, the two inputs can't be switched at a high speed. Further, where charging and discharging of the data line at a high speed is required, consumption of power increases greatly.

OBJECTS AND SUMMARY OF THE INVENTION

An object of the present invention is to provide a sense amplifier circuit which can switch plural inputs at a high speed and can be operated with low power.

Namely, the present invention provides a sense amplifier circuit which has first and second transistors connected in parallel to each other and both first and second transistors connected to another transistor in order to provide a true output signal. The invention also has third and fourth transistors connected in parallel to each other and both third and fourth transistors connected to another transistor in order to provide an inverse output signal. The true input signal and its inverse input signal are supplied respectively to the gates of said third transistor and said first transistor through a first pair of transfer gates, and a second true input and its inverse input signal are supplied respectively to the gates of said fourth transistor and said second transistor through a second pair of transfer gates.

Other objects, features and advantages of the invention will appear more fully from the following detailed description thereof taken in connection with the accompanying drawings.

DESCRIPTION OF THE PREFERRED EMBODIMENTS

The preferred embodiments of the present invention will be explained below in detail.

Figure 3:
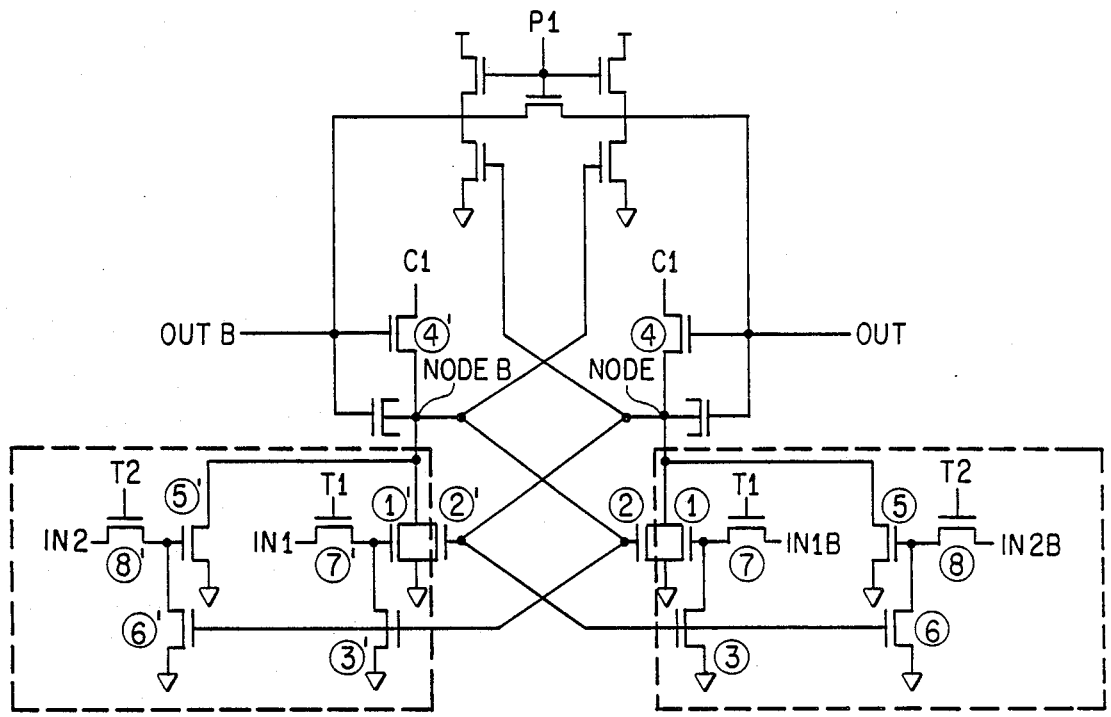
FIG. 3 is an equivalent circuit diagram of a sense amplifier circuit based on the preferred embodiment of the present invention.

FIG. 3 shows an example of a sense amplifier circuit based on the present invention.

The sense amplifier circuit of the present invention has principal novelty in the sections enclosed by broken lines. A first transistor 1 and a second transistor 5 are connected in parallel to each other and each is connected as shown to the transistor 4 in order to provide a true output signal (OUT). The circuit has a third transistor 1' and fourth transistor 5' connected in parallel to each other and each is connected as shown to the transistor 4' in order to provide an inverse output signal (OUT B). The sense amplifier circuit is constructed so that a first true input signal IN1 and its inverse input IN1B are supplied respectively to the gates of the third transistor 1' and the first transistor 1 through each of the respective transfer gates 7' and 7. A second true input signal IN2 and its inverse input IN2B are supplied respectively to the gates of the fourth transistor 5' and the second transistor 5 through each of the respective transfer gates 8' and 8.

The operation of this sense amplifier will be explained below:

(1) Inputs are set so that IN1=$V_{DD}$ which is greater than IN1B; IN1B greater than VT. OUT and OUT B are precharged when P1 is "H". After sufficient precharge, P1=$V_{SS}$, C1=$V_{SS}$ and NODE=NODEB=$V_{SS}$.

(2) T1 is switched to "H" and 1 and 1' are turned on. The on-resistance of 1 is higher than that of 1' because the voltage of IN1B is lower.

(3) When a clock pulse applied to C1 changes C1 from $V_{SS}$ to $V_{DD}'$, the voltage of NODE is greater than the voltage of NODEB and the on-resistance of 2' is less than the on-resistance of 2 because of the difference of on-resistance between 1 and 1'. This assists 2 to discharge NODEB (however, because the voltage of NODEB may be less than or equal to VT as NODEB discharges, it cannot be determined whether 2 is on or off during discharge. Further, 3 also tends to discharge IN1B.

Therefore, a current which flows through 4', 1'; 4', 2'; 3' decreases because of the high on-resistance of 1'. The same result occurs when input is switchably supplied to IN2 and IN2B, wherein a current which flows through 4', 5'; 4', 2'; 6' also decreases because of the high on-resistance of 5'. Thus when input is supplied the gates of the transistors 1, 1' and 5, 5', through current can be reduced based on the difference of on-resistance and lowering of power can be achieved. In the present embodiment, further reduction of consumed power can be achieved by the addition of the transistors 3, 3' and 6, 6'.

Additionally, in the above two inputs-supplying system, switching of input in the sequence T1, T2, T1 . . . can be implemented continuously at high speed by selective operation of each transfer gate from "ON" to "OFF". That is, the transistors 5 and 5' are connected in parallel with 1 and 1' and respectively to NODE and NODEB. The gate inputs of 1, 5, 1' and 5' are controlled by the respective transfer gates 7, 8 and 7', 8' to effect switching of two inputs in high speed.

Figure 4:
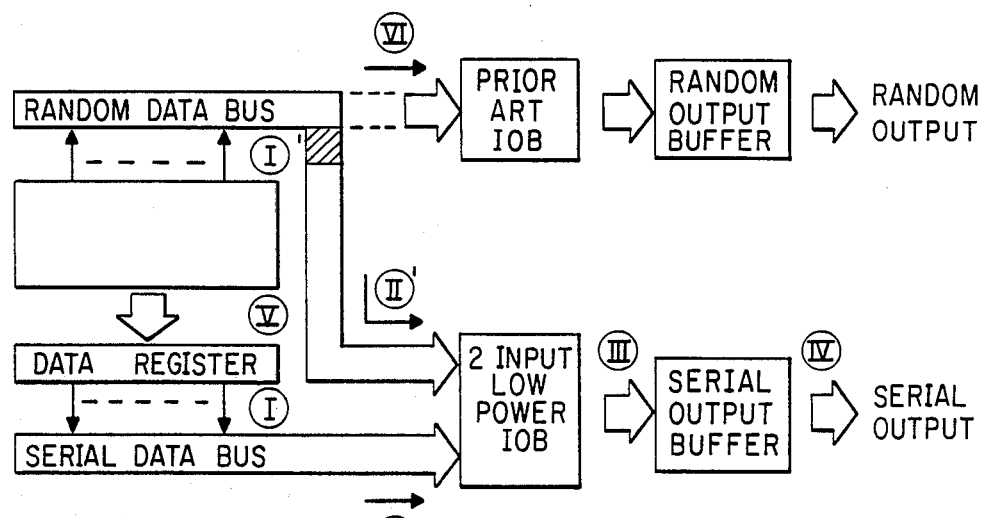
FIG. 4 is a schematic block diagram of a video RAM.

FIG. 4 shows a example wherein the above described sense amplifier circuit is applied to a serial IOB (input output buffer) of a video RAM.

In this video RAM, a serial portion added to a memory cell (a random portion) is normally operated as described below. Data is written on a data bus from a data register as shown at I. The data is sensed by the two inputs low power IOB comprising the above described sense amplifier circuit as shown at II. This data is then sent to a serial output buffer as shown at III and is output as shown at IV. The above cycle takes 33 nsec. However, when using mid-scan load, the cycle including the transfer shown at V from the memory cell to the data register and the sequence of I, II, III, and IV can be implemented within 33 nsec.

Figure 1:
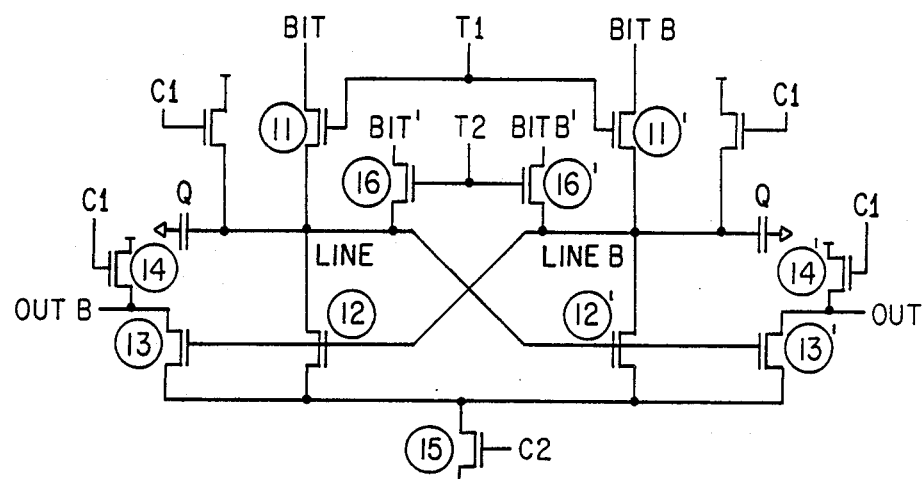
FIG. 1 is an equivalent circuit diagram of a prior art sense amplifier circuit.
Figure 2:
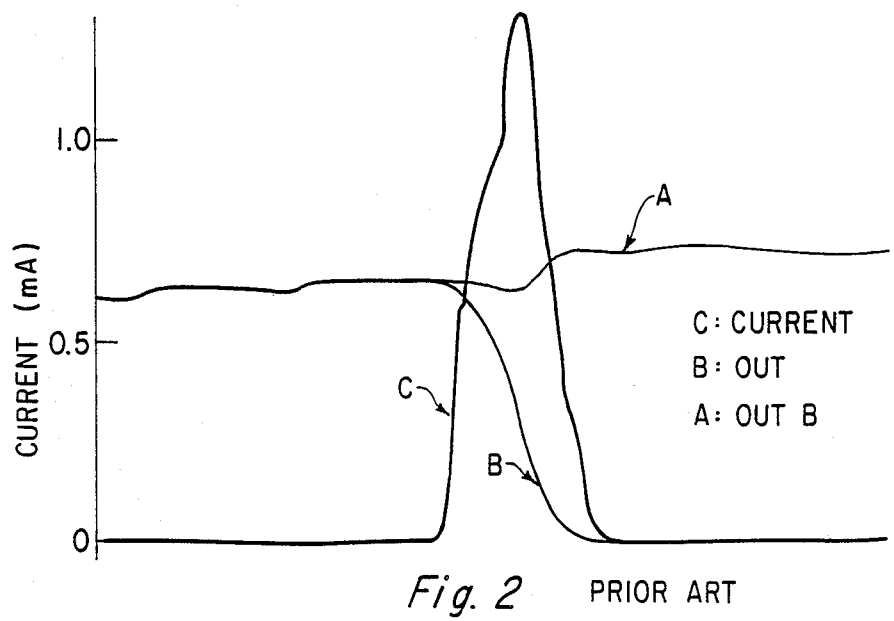
FIG. 2 is a simulation diagram showing characteristics of the same sense amplifier circuit of FIG. 1.
Figure 5:
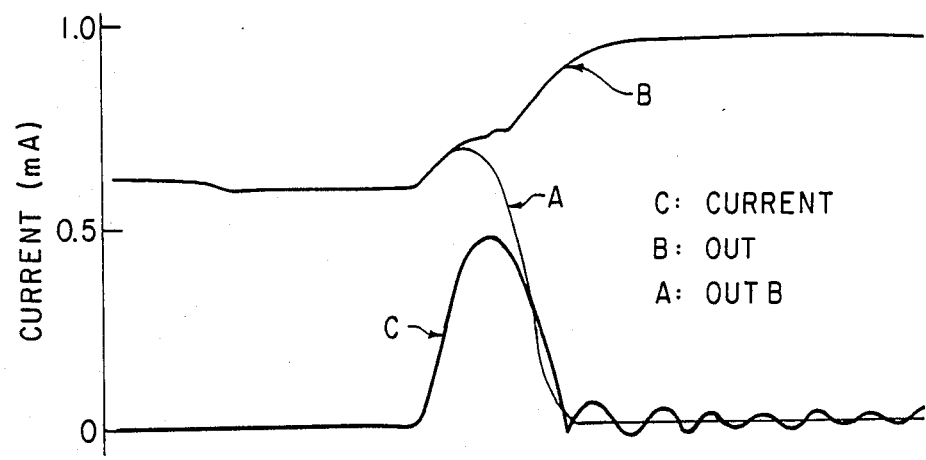
FIG. 5 is a simulation diagram showing characteristics of the sense amplifier circuit of the present invention.

When the sense amplifier of the present invention is used as a two inputs low power IOB, a random portion doesn't operate on the transfer V. Normally the memory cell is connected to a prior art IOB as shown by the sequence I' through VI to a random output buffer. However, according to the present embodiment, the memory cell is connected as shown to the random portion of the IOB by the sequence I', II', III, and IV to output first data. And, when inputting second groups of data, the second groups of data are output through the sequence I, II, III, and IV as described above. Further, in −12 timing (an access time from RAS is 120 nsec), a random cycle time is 230 nsec, and a serial cycle time is 33 nsec, the speed of the serial operation being about 7 times larger than the random operation. Therefore, a device having the least power consumption is preferable when used as a serial IOB. A device having such low power consumption is obtained with the sense amplifier circuit of the present invention. FIG. 5 shows the result of a simulation using the present invention as a two-inputs IOB and FIG. 2 shows the result of a simulation using an IOB of the prior art. As shown in FIG. 2 and FIG. 5, a peak current of about 1.3 mA is obtained in operation of such a prior art IOB (FIG. 2) and a peak current of about 0.5 mA is obtained in operation of the present invention (FIG. 5). It will be evident that various modifications can be made to the described embodiments without departing from the scope of the present invention.

For example, kinds of circuit elements used for the sense amplifier circuit as well as a method of the connection and the like can be variously modified. Control signals of each transfer gate can be obtained by known decoder systems, and three inputs or more can be switched in the same way as described above. Further, the present invention can be applied to the devices other than a video RAM as a matter of course.

In the present invention, as mentioned above, because input is supplied into each gate of each transistor, through current can be reduced based on the difference of on-resistance and lowering of power can be achieved. Further, because input is supplied through a transfer gate, switching of input can be implemented continuously at high speed by selective operation of each transfer gate.

We claim:

1. A sense amplifier circuit comprising: at least first and second transistors connected in parallel; a third transistor responsive to signals on the respective sources of said first and second transistors to provide a true output; at least fourth and fifth transistors connected in parallel; a sixth transistor responsive to signals on the respective sources of said fourth and fifth transistors to provide an inverse of the true output; and selectable first and second true inputs and respective first and second inverse inputs; said selectable first true input and it inverse being supplied respectively to the gates of said fourth and first transistors through a respective first pair of transfer gates, and said selectable second true input and its inverse being supplied respectively to the gates of said fifth and second transistors through a respective second pair of transfer gates.

2. A sense amplifier circuit as claimed in claim 1 wherein said transistor for providing said inverse output is responsive to signals on the source terminal of a seventh transistor connected in parallel with said first transistor, the gate of said seventh transistor responsive to signals on the source terminals of said first and second transistors, and said transistor for providing said true output is responsive to signals on the source terminal of an eight transistor connected in parallel with said third transistor, the gate of said eighth transistor responsive to signals on the source terminals of said fourth and fifth transistors.

3. A sense amplifier circuit as claimed in claim 2 wherein ninth and tenth transistors have their sources connected to the gates of said first and second transistors respectively, said ninth and tenth transistors having their gates connected to each other and to the gate of said sixth transistor, and eleventh and twelfth transistors have their sources connected to each gate of said third and fourth transistors respectively, said eleventh and twelfth transistors having their gates connected to each other and to the gate of said fifth transistor.

4. A sense amplifier circuit as claimed in claim 1 wherein a first control signal is applied to the gates of the transfer gates associated with said first and third transistors and a second control signal is applied to the gates of the transfer gates associated with said second and fourth transistors.

5. A sense amplifier circuit as claimed in claim 1 for use as a two inputs output buffer to a video RAM wherein one input of said two inputs is connected to a data bus receiving random data from a data register, and the other input is connected to a data bus receiving serial data from said data register.

* * * * *